(12) United States Patent
Anderson

(10) Patent No.: US 6,406,543 B1
(45) Date of Patent: *Jun. 18, 2002

(54) INFRA-RED TRANSPARENT THERMAL REACTOR COVER MEMBER

(75) Inventor: Roger N. Anderson, San Jose, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,620

(22) Filed: Jul. 23, 1998

(51) Int. Cl.$^7$ ............................................. C23C 16/00
(52) U.S. Cl. ...................................................... 118/715
(58) Field of Search ......................................... 118/715

(56) References Cited

U.S. PATENT DOCUMENTS

| | | |
|---|---|---|
| 4,920,918 A | 5/1990 | Adams et al. |
| 5,085,887 A | 2/1992 | Adams et al. |
| 5,108,792 A | 4/1992 | Anderson et al. |
| 5,194,401 A | 3/1993 | Adams et al. |
| 5,551,982 A * | 9/1996 | Anderson et al. ............ 118/715 |
| 5,916,370 A | 6/1999 | Chang |
| 6,099,648 A * | 8/2000 | Anderson ..................... 118/715 |

FOREIGN PATENT DOCUMENTS

| | | |
|---|---|---|
| EP | 0474 251 A1 | 3/1995 |
| EP | 0675 524 A1 | 3/1995 |
| EP | 2 763 964 | 5/1997 |
| WO | WO 99/07925 | 8/1998 |

OTHER PUBLICATIONS

Copy of International PCT Search Report PCT/US 99/16583.
Copy of International PCT Search Report PCT/US 98/16185.
Copy of European Search Report EP 91 11 5124.

* cited by examiner

Primary Examiner—Gregory Mills
Assistant Examiner—Sylvia R. MacArthur
(74) Attorney, Agent, or Firm—Blakely Sokoloff Taylor & Zafman

(57) ABSTRACT

A cover member for a semiconductor processing thermal reactor. The cover member has a central quartz window portion and an outer flange portion. The central window portion has either an inward bow defining a concave outside surface, or an outward bow defining a convex outside surface. The centerline of the central window portion has a radius of curvature which when extended through the flange portion divides the flange portion into an upper flange section and a lower flange section. The upper and lower flange portions having substantially equal masses.

21 Claims, 5 Drawing Sheets

INFRA-RED TRANSPARENT THERMAL REACTOR COVER MEMBER

FIELD OF THE INVENTION

The present invention relates to thermal reactors for processing semiconductor wafers, and more particularly to a reactor having a domed window with the center of mass equally distributed within the flange portion of the window.

BACKGROUND OF THE INVENTION

Recent technological progress is closely identified with the increasing miniaturization of electronic circuits made possible by advances in semiconductor processing. Certain advanced processing techniques require exposing a semi-conductor structure to a reactant gas under carefully controlled conditions. Examples of such processes include chemical vapor deposition and etching processes. Of particular concern is the uniformity of temperature and gas flow to ensure uniform results, e.g., deposition thickness, across a wafer.

The process of depositing layers on a semiconductor wafer (or substrate) usually involves placing the substrate within a thermal reactor chamber and holding the wafer within a stream of a reactant gas flowing across the surface of a wafer. The thermal reactor is heated by external lamps which pass infra-red radiation into the reactor chamber through upper and lower heating ports. The heating ports are covered by infra-red transparent cover members. The upper cover member is generally characterized by a central window portion and a flange portion. The flange portion serves to support the central window portion in the thermal reactor. During wafer processing stresses are created in the cover member due to a pressure differential across the cover and/or the thermal expansion due to heating of the central window portion. These stresses tend to localize in the flange portion of the cover member.

SUMMARY OF THE INVENTION

A cover member for a semiconductor processing thermal reactor is disclosed. The cover member has a central quartz window portion and an outer flange portion. The central window portion has either an inward bow defining a concave outside surface, or an outward bow defining a convex outside surface. The centerline of the central window portion has a radius of curvature which when extended through the flange portion divides the flange portion into an upper flange section and a lower flange section. The upper and lower flange portions having substantially equal masses.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A quartz window for a thermal reactor is disclosed. In the following description, numerous specific details are set forth, such as material types, dimensions, etc., in order to provide a thorough understanding of the present invention. However, it will be obvious to one of ordinary skill in the art that the invention may be practiced without these specific details. In other instances, well-known structures and processing steps have not been shown in particular detail in order to avoid unnecessarily obscuring the present invention.

Figure 1A:
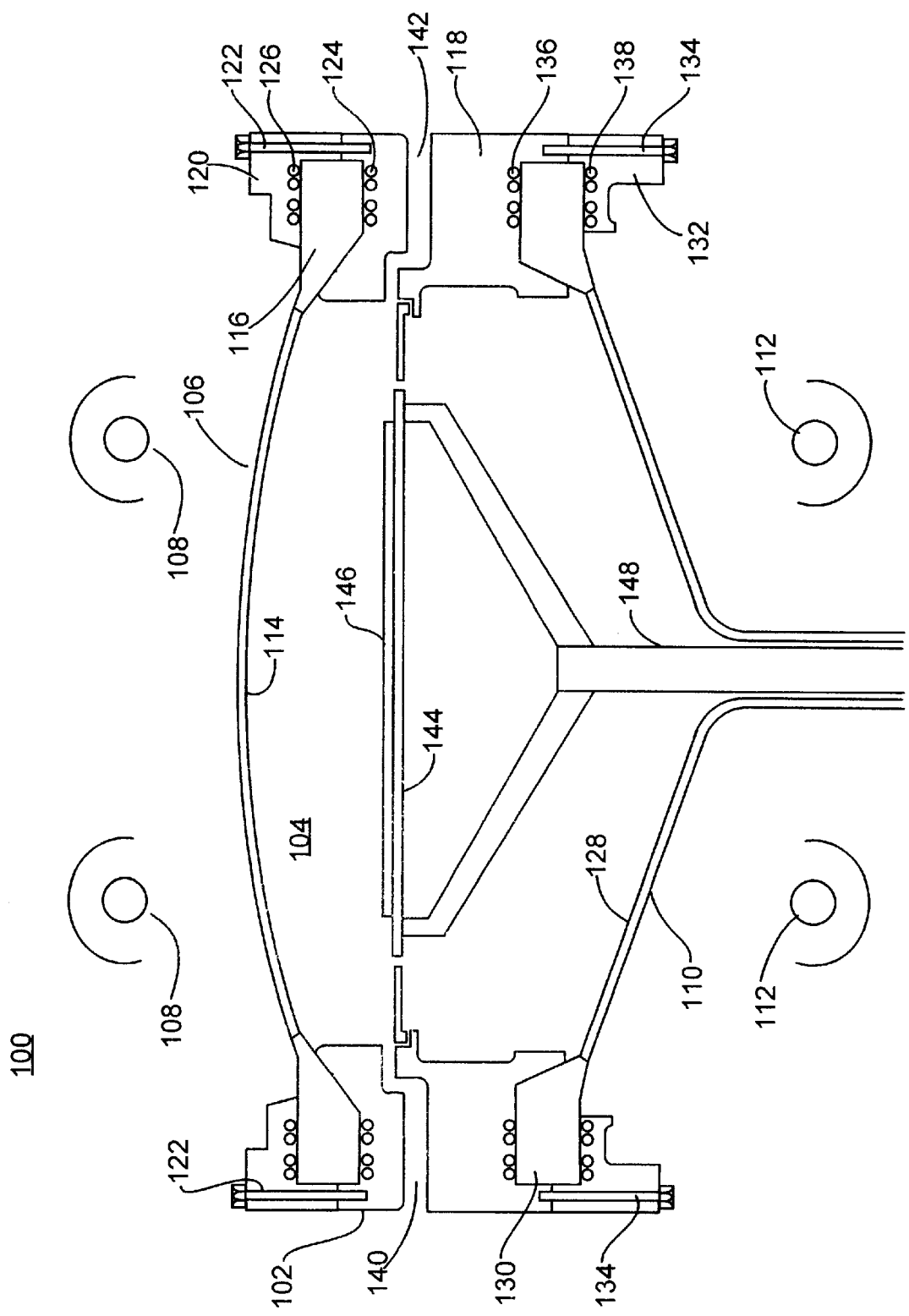
FIG. 1A is a cross-sectional view of a thermal reactor in one embodiment of the present invention.
Figure 1B:
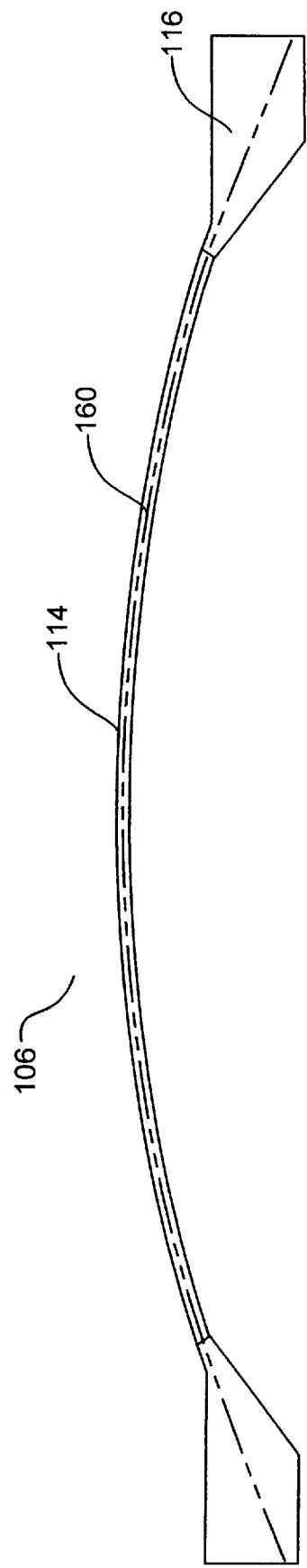
FIG. 1B is a cross-sectional view of the infra-red transparent cover member of FIG. 1A.
Figure 1C:
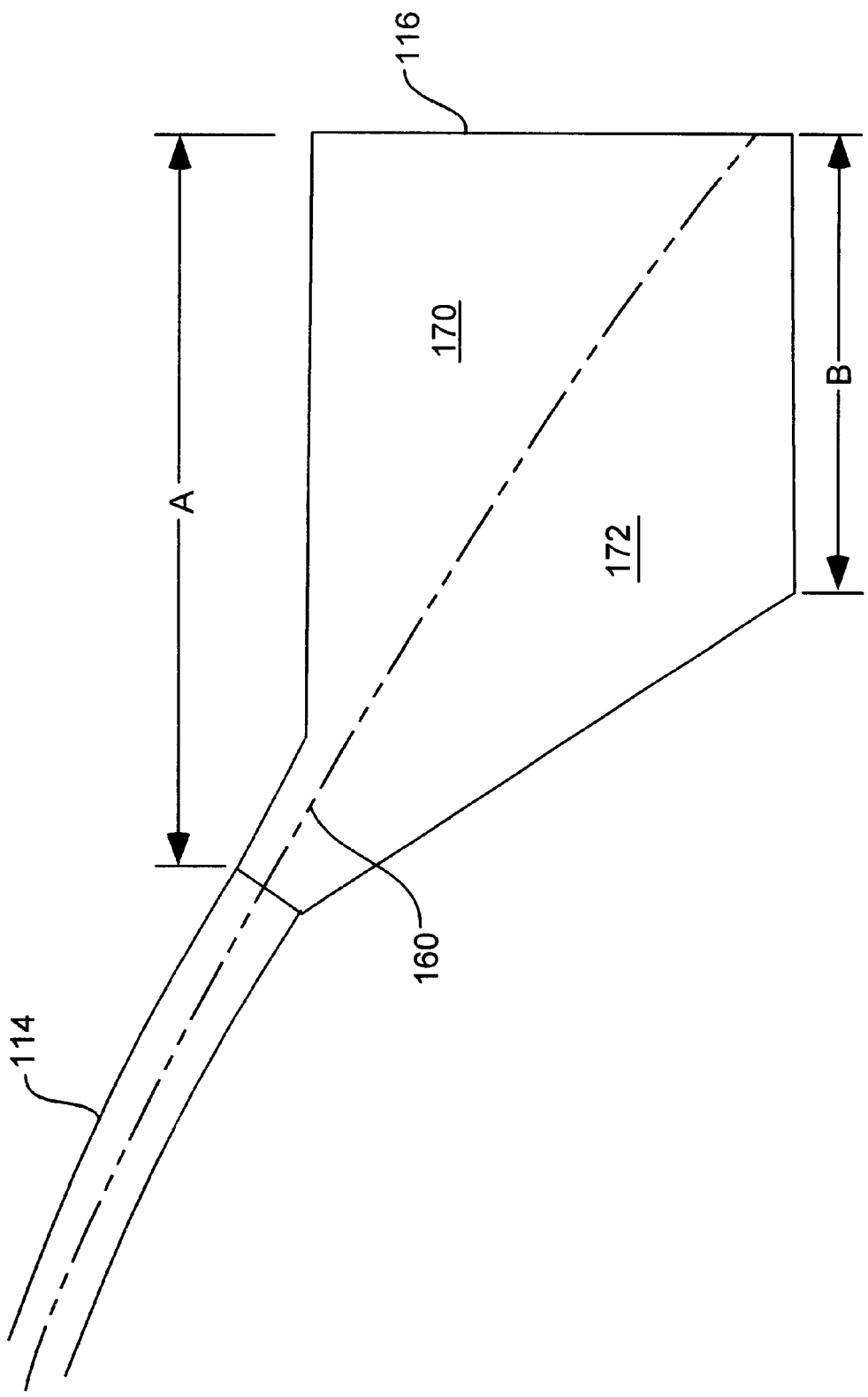
FIG. 1C is an enlarged view of the flange portion of the cover member shown in FIG. 1B.

With reference to FIGS. 1A through 1C, a thermal reactor in one embodiment of the present invention is illustrated. Thermal reactor 100 is formed by a reactor vessel 102 defining a wafer reactor chamber 104. Chamber 102 is defined, in part, by a cover member 106 mounted below an upper heating source 108, and a lower member 110 mounted above a lower heating source 112. Cover member 106 and lower member 110 are generally made of quartz. Heating sources 108 and 112 provide infra-red radiant heat into the chamber through members 106 and 110 which are transparent to infra-red radiation. Cover member 106 includes a central window portion 114 and a peripheral flange portion 116 for supporting the central window portion. The window portion 106 generally has a spherical shape. As viewed from above, flange portion 116 generally has a circular shape. Central window portion 114 is typically made of a clear fused silica quartz whereas the flange portion is made of an opaque quartz. The flange is captured between a baseplate 118 and an upper clamp ring 120. Clamp ring 120 is secured to baseplate 118 by a suitable clamping means such as locking bolts 122. It is appreciated that cover member 106 may be made entirely of a single material, such as fused silica quartz. Moreover, it is to be understood that the present invention is not limited to the manner in which the cover member is attached to the reactor housing.

In the embodiment illustrated in FIGS. 1A through 1C, central window portion 114 has an outward bow that forms a convex outside surface. The central window portion 114 has a centerline 160 having a curvature of radius. When extended through the flange portion 116 of cover member 106, the centerline 160 divides the flange portion into an upper flange section 170 and a lower flange section 172. The geometry's of central window portion 114 and flange portion 116 are configured such that the upper flange section 170 and the lower flange section 172 of flange portion 116 have substantially the same mass and/or cross-sectional area.

Cover member 106 is resiliently supported by a cushioning material such as base sealing rings 124 that are positioned between baseplate 118 and flange 116. Cover member 106 is further supported by clamp sealing O-rings 126 that are located between clamp ring 120 and flange 116. The O-rings are preloaded by the locking bolts 122 to provide a double seal for preventing the processing gas within chamber 104 from escaping into the ambient atmosphere. Lower member 110 also has a window portion 128 and a flange portion 130 that is similarly mounted between baseplate 118 and a lower clamp ring 132 with locking bolts 134 and O-rings 136 and 138.

Process gas enters chamber 104 through a gas inlet port 140 and exits the chamber through an exit port 142. The pressure of the gas within the chamber is maintained by metering the gas flow out of exit port 142.

A susceptor 144 is provided within chamber 104 for supporting a wafer 146. Susceptor 144 includes a mounting shaft 148 that is coupled to a motor (not shown). In this manner, wafer 148 may be rotated during processing to permit a more uniform heating and deposition.

As previously discussed, stresses in the cover member 106 are generally localized in the outer flange portion of the cover member. A salient feature of the present invention lies in the construction of the cover member 106. The domed or bowed configuration of central window portion 114 causes the stress within central window portion 114 to be transmitted into the flange portion 116. The flange portion thus acts to resist the outward expansion of the domed cover member 106 due to a pressure differential across the cover and/or the thermal expansion due to heating of central window portion 114. Since the upper flange section 170 and lower flange section 172 have substantially the same mass and/or cross-sectional area, the resisting force within flange portion 116 is equally distributed between the upper and lower flange sections. By equally distributing the mass of the flange portion on opposing sides of the centerline 160, the structural strength of the flange portion is effectively increased since the resisting forces are essentially equally divided between the upper and lower sections of the flange.

The diameter of window portion 114 may vary significantly from one thermal reactor to another. In one exemplary embodiment window portion 114 has a diameter of 17.5 inches and a radius of curvature of 35 inches. Depending upon the specific application, the radius of curvature typically is in the range of 15 to 100 inches. The thickness of central window portion 114 is generally between of 0.1 to 0.2 inches. The thickness of flange portion 116 is in the range of 0.5 to 1.5 inches. Flange dimensions "A" and "B" are approximately 3.0 and 1.6 inches, respectively. Flange dimension "A" may vary between 2.0 and 3.5 inches. Flange dimension "B" may vary between 0.75 to 2.0 inches.

Figure 2A:
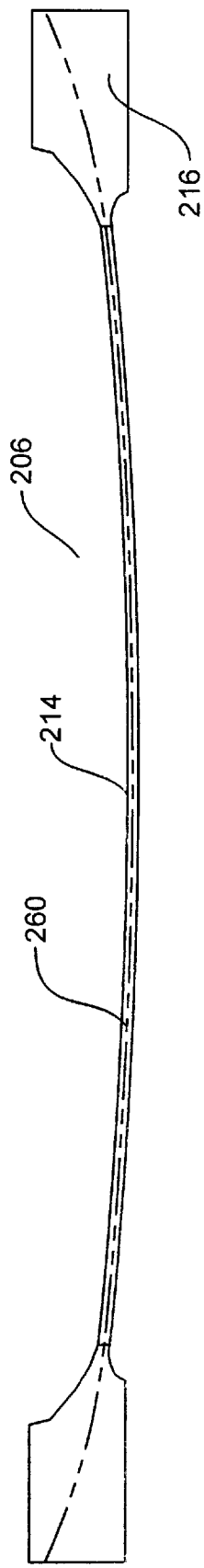
FIG. 2A is a thermal reactor cover member in another embodiment of the present invention.
Figure 2B:
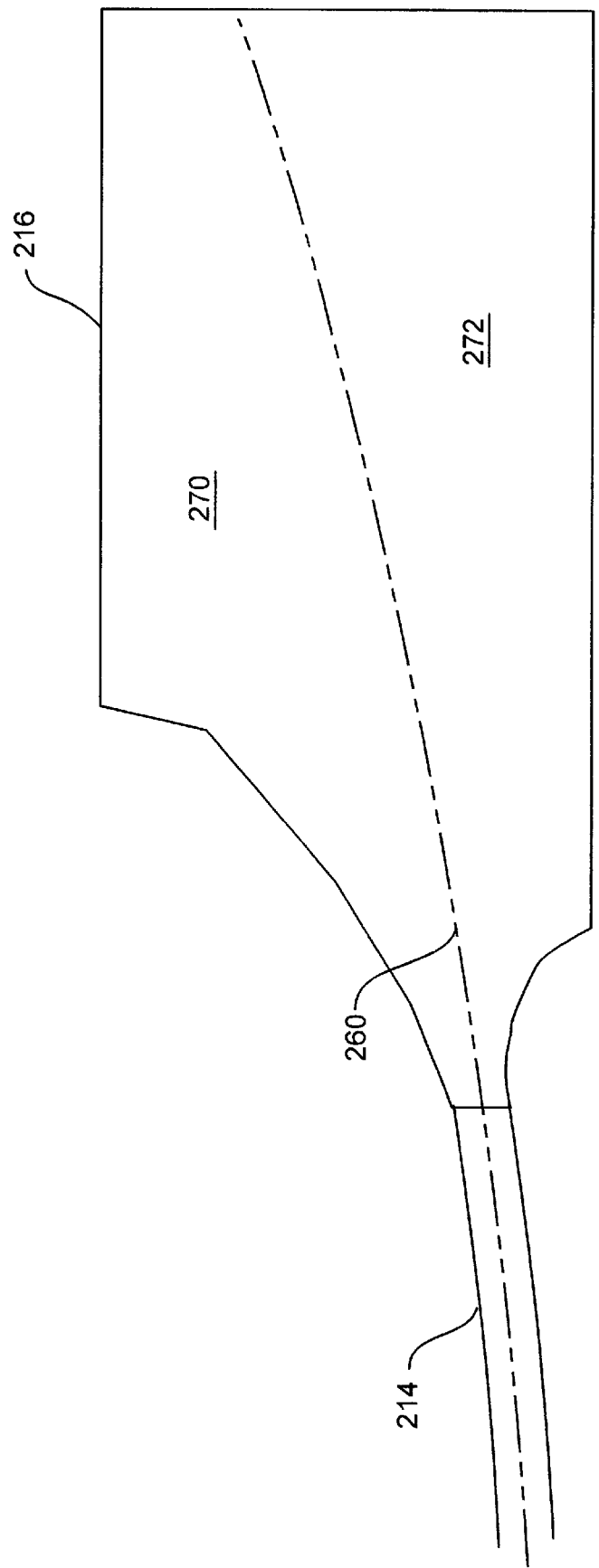
FIG. 2B is an enlarged view of the flange portion of the cover member shown in FIG. 2A.

Turning now to FIGS. 2A and 2B, a thermal reactor cover member 206 in accordance with another embodiment of the present invention is shown. Cover member 206 includes a central window portion 214 and a flange portion 216. The central window portion 214 has an inward bow that forms a concave outside surface. Cover member 206 is typically used in ambient pressure or above-ambient pressure thermal reactors. The central window portion 214 has a centerline 260 having a curvature of radius. When extended through the flange portion 216 of cover member 206, the centerline 260 divides the flange portion 216 into an upper flange section 270 and a lower flange section 272. The geometry's of central window portion 214 and flange portion 216 are configured such that the upper flange section 270 and the lower flange section 272 of flange portion 216 have substantially the same mass and/or cross-sectional area. As previously discussed, since the upper and lower flange sections have substantially the same mass and/or cross-sectional area, the resisting force within flange portion 216 is equally distributed between the upper and lower flange sections.

In one embodiment window portion 214 has a diameter of 17.5 inches. The radius of curvature of central window portion 114 is relatively large. In one embodiment, window portion 114 has a radius of curvature of 100 inches. Depending upon the specific application, the radius of curvature typically is in the range of 50 to 300 inches. The thickness of central window portion 114 is generally between of 0.1 to 0.2 inches. The thickness of flange portion 116 is in the range of 0.5 to 1.5 inches.

It is appreciated that the methods and apparatus of the present invention may be used for multiple wafer processing and single wafer processing. It is further understood that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. An infra-red transparent cover member for a thermal reactor comprising:

a central window portion having a centerline, the centerline having a radius of curvature; and a flange portion, the centerline of the central window portion when extended through the flange portion dividing the flange portion into an upper flange section and a lower flange section, the upper and lower flange sections having substantially the same cross-sectional area.

2. The cover member of claim 1 wherein the central window portion has an outward bow defining a convex outside surface.

3. The cover member of claim 2 wherein the radius of curvature of the central window portion is in the range of 15 to 100 inches.

4. The cover member of claim 1 wherein the central window portion has an inward bow defining a concave outside surface.

5. The cover member of claim 4 wherein the radius of curvature of the central window portion is in the range of 50 to 300 inches.

6. The cover member of claim 1 wherein the central window portion is made of clear fused silica quartz.

7. The cover member of claim 1 wherein the flange portion is made of opaque silica quartz.

8. A thermal reactor for processing a semiconductor wafer comprising:

a wafer chamber for containing at least one semiconductor wafer during processing;

a window member at least partially defining the wafer chamber, the window member comprising a flange portion and a central window portion having a center line with a radius of curvature, the center line of the central window portion when extended through the flange portion dividing the flange portion into an upper flange section and a lower flange section, the upper and lower flange sections having substantially the same cross-section area.

9. The cover member of claim 8 wherein the central window portion has an outward bow defining a convex outside surface.

10. The cover member of claim 9 wherein the radius of curvature of the central window portion is in the range of 15 to 100 inches.

11. The cover member of claim 8 wherein the central window portion has an inward bow defining a concave outside surface.

12. The cover member of claim 11 wherein the radius of curvature of the central window portion is in the range of 50 to 300 inches.

13. The cover member of claim 8 wherein the central window portion is made of clear fused silica quartz.

14. The cover member of claim 8 wherein the flange portion is made of opaque silica quartz.

15. An infra-red transparent cover member for a thermal reactor comprising:
- a central window portion having a centerline, the centerline having a radius of curvature; and
- a flange portion, the centerline of the central window portion when extended through the flange portion dividing the flange portion into an upper flange section and a lower flange section, the upper and lower flange sections having substantially the same mass.

16. The cover member of claim 15 wherein the central window portion has an outward bow defining a convex outside surface.

17. The cover member of claim 16 wherein the radius of curvature of the central window portion is in the range of 15 to 100 inches.

18. The cover member of claim 15 wherein the central window portion has an inward bow defining a concave outside surface.

19. The cover member of claim 18 wherein the radius of curvature of the central window portion is in the range of 50 to 300 inches.

20. The cover member of claim 15 wherein the central window portion is made of clear fused silica quartz.

21. The cover member of claim 15 wherein the flange portion is made of opaque silica quartz.

* * * * *